(12) United States Patent
Wang et al.

(10) Patent No.: US 7,323,392 B2
(45) Date of Patent: Jan. 29, 2008

(54) HIGH PERFORMANCE TRANSISTOR WITH A HIGHLY STRESSED CHANNEL

(75) Inventors: Chih-Hao Wang, Hsin-Chu (TW); Ching-Wei Tsai, Taoyuan (TW); Ta-Wei Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 11/391,061

(22) Filed: Mar. 28, 2006

(65) Prior Publication Data

US 2007/0231999 A1    Oct. 4, 2007

(51) Int. Cl.
*H01L 21/336*    (2006.01)
(52) U.S. Cl. ............ 438/285; 438/199; 438/218; 438/294; 257/E21.177
(58) Field of Classification Search ............ 438/218, 438/285, 454; 257/E21.177, E21.182, E21.4, 257/E21.097, E21.191, E21.213, E21.615
See application file for complete search history.

(56) References Cited

U.S. PATENT DOCUMENTS

| | | | |
|---|---|---|---|
| 6,730,551 | B2 | 5/2004 | Lee et al. |
| 6,881,635 | B1 | 4/2005 | Chidambarrao et al. |
| 7,238,555 | B2 * | 7/2007 | Orlowski et al. ............ 438/151 |
| 2003/0162348 | A1 | 8/2003 | Yeo et al. |
| 2003/0227072 | A1 | 12/2003 | Forbes et al. |
| 2004/0175872 | A1 | 9/2004 | Yeo et al. |
| 2005/0242340 | A1 * | 11/2005 | Chidambarrao et al. ...... 257/19 |
| 2007/0134859 | A1 * | 6/2007 | Curello et al. ............... 438/151 |

OTHER PUBLICATIONS

Yin, H., et al., "Fully-Depleted Strained-Si on Insulator NMOSFETs without Relaxed SiGe Buffers," IEDM, 2003, pp. 53-56.
Yeo, Y.-C., et al., "Enhanced Performance in Sub-100 nm CMOSFETs Using Strained Epitaxial Silicon-Germanium," IEDM, 2000, pp. 753-756.
Nayak, D. K., et al., "Enhancement-Mode Quantum-Well $Ge_x Si_{1-x}$ PMOS," IEEE Electron Device Letters, vol. 12, No. 4, Apr. 1991, pp. 154-156.

(Continued)

*Primary Examiner*—Michael Lebentritt
*Assistant Examiner*—Cheung Lee
(74) *Attorney, Agent, or Firm*—Slater & Matsil, L.L.P.

(57) ABSTRACT

A MOS transistor having a highly stressed channel region and a method for forming the same are provided. The method includes forming a first semiconductor plate over a semiconductor substrate, forming a second semiconductor plate on the first semiconductor plate wherein the first semiconductor plate has a substantially greater lattice constant than the second semiconductor plate, and forming a gate stack over the first and the second semiconductor plates. The first and the second semiconductor plates include extensions extending substantially beyond side edges of the gate stack. The method further includes forming a silicon-containing layer on the semiconductor substrate, preferably spaced apart from the first and the second semiconductor plates, forming a spacer, a LDD region and a source/drain region, and forming a silicide region and a contact etch stop layer. A high stress is developed in the channel region. Current crowding effects are reduced due to the raised silicide region.

14 Claims, 8 Drawing Sheets

OTHER PUBLICATIONS

Ismail, K., et al., "Electron Transport Properties of Si/SiGe Heterostructures: Measurements and Device Implications," Appl. Phys. Lett., vol. 63, No. 5, Aug. 2, 1993, pp. 660-662.

Kawasaki, H., et al., "Impact of Parasitic Resistance and Silicon Layer Thickness Scaling for Strained-Silicon MOSFETs on Relaxed $Si_{1-x}Ge_x$ Virtual Substrate," IEEE, 2004, 4 pages.

* cited by examiner

HIGH PERFORMANCE TRANSISTOR WITH A HIGHLY STRESSED CHANNEL

CROSS-REFERENCE TO RELATED APPLICATION

This application is related to commonly assigned U.S. patent application Ser. No. 11/115,484, filed Apr. 27, 2005, and entitled "High Performance CMOS Device Design," which application is incorporated herein by reference.

TECHNICAL FIELD

This invention relates generally to semiconductor devices, and more specifically to metal-oxide-semiconductor (MOS) devices having stressed channel regions.

BACKGROUND

The scaling of VLSI circuits is a constant effort. With circuits becoming smaller and faster, device driving current improvement becomes more important. Metal-oxide-semiconductor (MOS) transistor current is closely related to gate length, gate capacitance, and carrier mobility. Shortening poly-gate length, increasing gate capacitance and increasing carrier mobility can improve the transistor current performance. Gate length reduction is an ongoing effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a stressed channel region is a known practice. Stress, sometimes referred to as strain, can enhance bulk electron and hole mobility. The performance of a MOS transistor can be enhanced through a stressed-surface channel. This technique allows performance to be improved at a constant gate length, without adding complexity to circuit fabrication or design.

Figure 1:
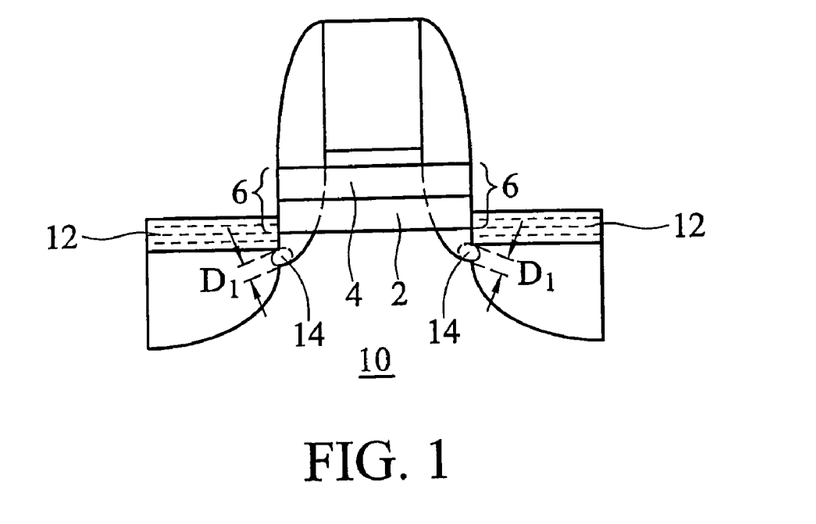
FIG. 1 illustrates a MOS transistor embodiment having improved stress in the channel region, wherein a silicon layer and a SiGe layer having free surfaces are under the gate.

FIG. 1 illustrates a variation of an NMOS transistor such as described in U.S. patent application Ser. No. 11/115,484, which is incorporated herein by reference. The NMOS transistor includes a SiGe layer 2 on a semiconductor substrate 10, and a silicon layer 4 on the SiGe layer 2. Due to mismatched lattice constants between SiGe layer 2 and silicon layer 4, an inherent tensile stress is developed in silicon layer 4 and an inherent compressive stress is developed in SiGe layer 2. The channel region in the silicon layer 4 is thus tensile-stressed. Free surfaces 6 allow the development of high stresses when the Si/SiGe layers are annealed. FIG. 1 also includes silicide regions 12, which are not included in U.S. patent application Ser. No. 11/115,484.

The transistor shown in FIG. 1 has high performance due to a highly stressed channel region, particularly when formed using 90 nm technology and above. However, if this embodiment is to be used for future-generation integrated circuits, such as integrated circuits manufactured using 65 nm or 45 nm technology, shallower junctions will cause current crowding effects in narrow regions 14, which are close to corners of the respective silicide layers 12. The current crowding effects result in increased external resistance and can severely degrade the performance of the transistors. For example, for integrated circuits fabricated using 65 nm technology, drive current $I_{on}$ of transistors may be degraded by about 12 percent or more due to current crowding effects. This at least partially offsets the benefit introduced by a stressed channel region. Leakage currents between the silicide regions 12 and substrate 10 also increase due to a short distance $D_1$ between silicide regions 12 and substrate 10.

Therefore, there is a need for a novel method suitable for forming future-generation integrated circuits, so that increasingly shallower junctions can be formed without causing significant current crowding effects and leakage currents.

SUMMARY OF THE INVENTION

The preferred embodiments of the present invention provide a MOS transistor having a highly stressed channel region and a method for forming the same.

In accordance with one aspect of the present invention, the MOS transistor includes a first semiconductor plate over the semiconductor substrate and a second semiconductor plate on the first semiconductor plate, wherein the first semiconductor plate has a substantially greater lattice constant than the second semiconductor plate. The MOS transistor further includes a gate dielectric over the second semiconductor plate and a gate electrode over the gate dielectric, wherein the first and the second semiconductor plates comprise extensions extending beyond side edges of the gate electrode. A gate spacer is formed along sidewalls of the gate electrode, the gate dielectric and the first and the second semiconductor plates. The gate spacer has a bottom surface comprising a first portion on the second semiconductor plate, a second portion on the semiconductor substrate and adjacent the first portion, and a third portion adjacent and substantially higher than the second portion. The MOS transistor is preferably an NMOS transistor.

In accordance with another aspect of the present invention, the method for forming the preferred embodiments of the present invention includes forming a first semiconductor plate over a semiconductor substrate, forming a second semiconductor plate on the first semiconductor plate wherein the first semiconductor plate has a substantially greater lattice constant than the second semiconductor plate, and forming a gate stack over the first and the second semiconductor plates. The first and the second semiconductor plates include extensions extending substantially beyond side edges of the gate stack. The method further includes forming an additional (silicon-containing) layer on the semiconductor substrate, preferably spaced apart from the first and the second semiconductor plates, and forming a spacer, a LDD region and a source/drain region. A silicide region and a contact etch stop layer are then formed. With the raised additional layer in the source/drain region, the resulting silicide is also raised.

The formation processes of the preferred embodiments of the present invention utilize free surfaces for the development of stress in the channel region. The resulting MOS transistor thus has high performance. In addition, forming raised silicide regions reduces current crowding effects.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
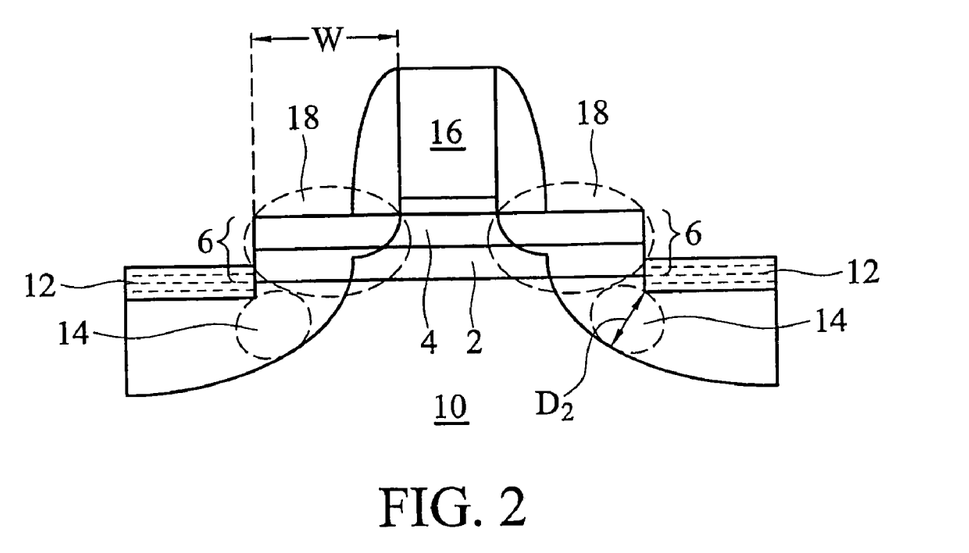
FIG. 2 illustrates a MOS transistor embodiment, wherein a silicon layer and a SiGe layer underlying the gate extend substantially beyond edges of the gate.

A possible solution for the problems caused by the scaling of the integrated circuits is shown in FIG. 2, which shows a modified version of the embodiment shown in FIG. 1. The silicon layer 4 and SiGe layer 2 are extended substantially beyond the edges of the gate electrode 16. Therefore, the crowded regions 14 have greater dimensions, and the silicide regions 12 have a greater distance $D_2$ from the substrate 10 than $D_1$ (refer to FIG. 1), so that current crowding effects are reduced. This solution, however, is difficult to implement in the manufacturing processes. Typically, disposable spacers need to be formed in order to form extended regions 18. To effectively reduce current crowding effects, the width W of the extended regions 18 preferably has a great value, for example, greater than about 500 Å. This requires the disposable spacers to have a similar thickness. However, due to small gate-to-gate spacing in future-generation integrated circuits, it is hard to form and pattern disposable spacers with such a great thickness. Additionally, with the extended regions 18 having a great width W, the free surfaces 6 are further away from the gate edges, causing decreased stress in the channel region.

Therefore, the width W of the extended regions 18 is limited, and the current crowding effects cannot be effectively reduced by using the method shown in FIG. 2. A solution to these problems is provided by the preferred embodiments of the present invention, as will be discussed hereinafter.

The intermediate stages of manufacturing preferred embodiments of the present invention are illustrated in FIGS. 3 through 13. Throughout the various views and illustrative embodiments of the present invention, like reference numbers are used to designate like elements. Each figure number may be followed by a letter indicating a variation of the same structure or process step.

Figure 3:
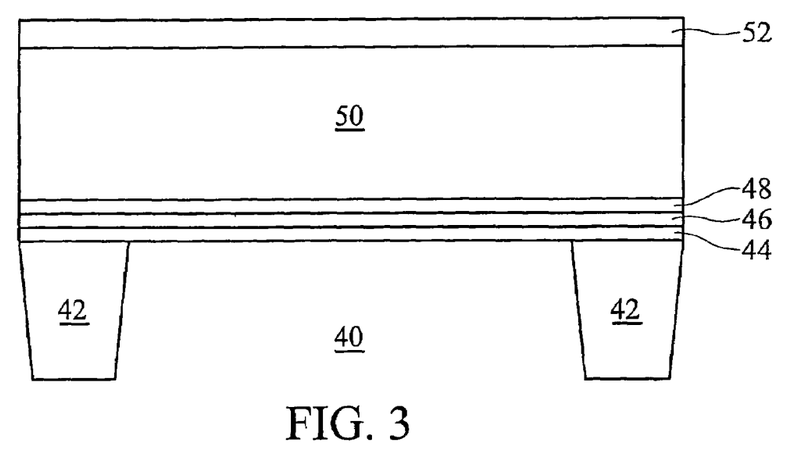
FIGS. 3 through 13 are cross-sectional views of intermediate stages in the manufacture of a MOS transistor embodiment.

FIG. 3 illustrates an initial structure comprising stacked layers formed on a substrate 40. The substrate 40 comprises a semiconductor material, preferably silicon, and may be in the form of bulk silicon or a well-known silicon-on-insulator (SOI) structure. Shallow trench isolation (STI) regions 42 are formed in the substrate 40.

The stacked layers include a first semiconductor layer 44, a second semiconductor layer 46, a gate dielectric layer 48, a gate electrode layer 50, and a hard mask layer 52. The first semiconductor layer 44 preferably comprises SiGe with between about 10 and about 40 atomic percentage germanium, and is alternatively referred to as SiGe layer 44.

In the preferred embodiment, the second semiconductor layer 46 is formed of silicon, hence is also referred to as silicon layer 46. In other embodiments, it comprises materials such as silicon, germanium, carbon, and the like, and the germanium concentration is preferably less than that in the SiGe layer 44.

The SiGe layer 44 preferably has a substantially greater lattice constant than the silicon layer 46, thus a tensile stress is generated in the silicon layer 46, and a compressive stress is generated in the SiGe layer 44. The atomic percentage of germanium in the SiGe layer 44 determines its lattice constant, and thus determines the magnitude of the tensile stress in the silicon layer 46 and the compressive stress in the SiGe layer 44. Typically, a greater germanium atomic percentage results in greater stresses and better device performance. For example, with 20 atomic percent germanium in the SiGe layer 44 and about 0 atomic percent germanium in the silicon layer 46, a drive current to leakage current ratio ($I_{on}/I_{off}$), which is commonly used as a criteria of the device performance, can be improved by about 24 percent over prior art devices. If the germanium atomic percentage is about 27 percent in the SiGe layer 44, the $I_{on}/I_{off}$ ratio can be improved by about 36 percent. Preferably, the silicon layer 46 has a tensile stress of greater than about 100 MPa.

The thickness of SiGe layer 44 is preferably between about 10 Å and about 100 Å, and more preferably between about 30 Å and about 50 Å. Silicon layer 46 preferably has a thickness greater than the depth of the channel region of the respective transistor, preferably between about 30 Å and about 500 Å, and more preferably between about 50 Å and about 150 Å.

In the preferred embodiment, gate dielectric layer 48 comprises $SiO_2$. In other embodiments, gate dielectric layer 48 is formed of oxynitrides, nitrides, high-k materials, and the like. Gate electrode layer 50 is preferably formed of polysilicon, although it may be formed of other commonly used materials such as metals, metal silicides, and the like. Hard mask layer 52 preferably comprises silicon nitride or other commonly used materials.

Figure 4:
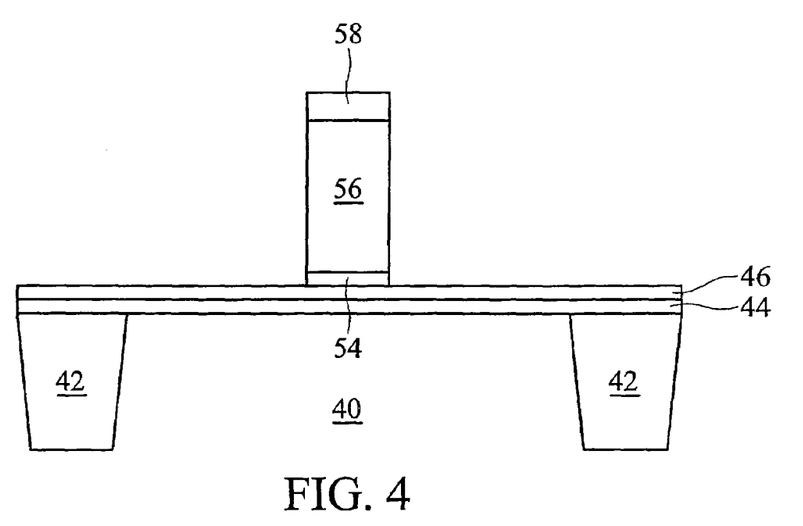

Gate dielectric layer 48, gate electrode layer 50 and hard mask layer 52 are then patterned, forming gate dielectric 54, gate electrode 56 and hard mask 58, respectively. The resulting structure is shown in FIG. 4.

Figure 5:
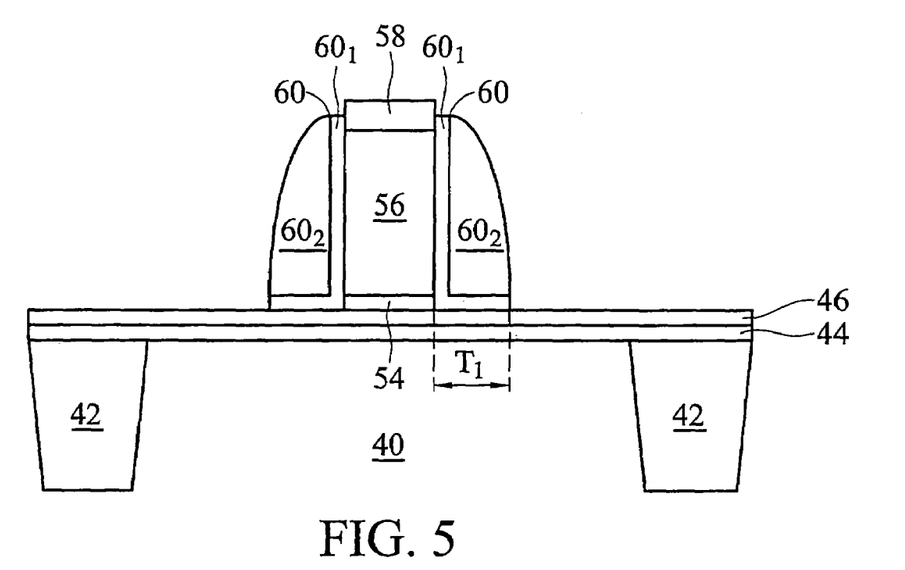

First disposable spacers 60 are then formed, as illustrated in FIG. 5. The formation of first disposable spacers 60 preferably includes blanket depositing one or more dielectric layer(s) over the entire region, and then anisotropically etching undesired portions from the horizontal surfaces. The first disposable spacers 60 may have a commonly used structure, such as a SiN $60_2$ on a $SiO_2$ $60_1$, although other structures comprising one layer or multi-layers, for example, an oxide-nitride-oxide structure or an oxide-nitride-oxide-nitride structure, can also be used. The thickness $T_1$ of first disposable spacers 60 is preferably less than about 500 Å, and more preferably between about 150 Å and about 450 Å. The thickness $T_1$ determines how far the subsequently formed free surfaces will be from the respective edges of the gate electrode 56. A greater thickness $T_1$ is helpful for reducing current crowding effects. However, the stress in the channel region of the resulting transistor is also reduced. Conversely, a smaller thickness $T_1$ increases both the current crowding effects and the stress. One skilled in the art will be able find an optimum $T_1$ value through routine experiments.

Figure 6A:
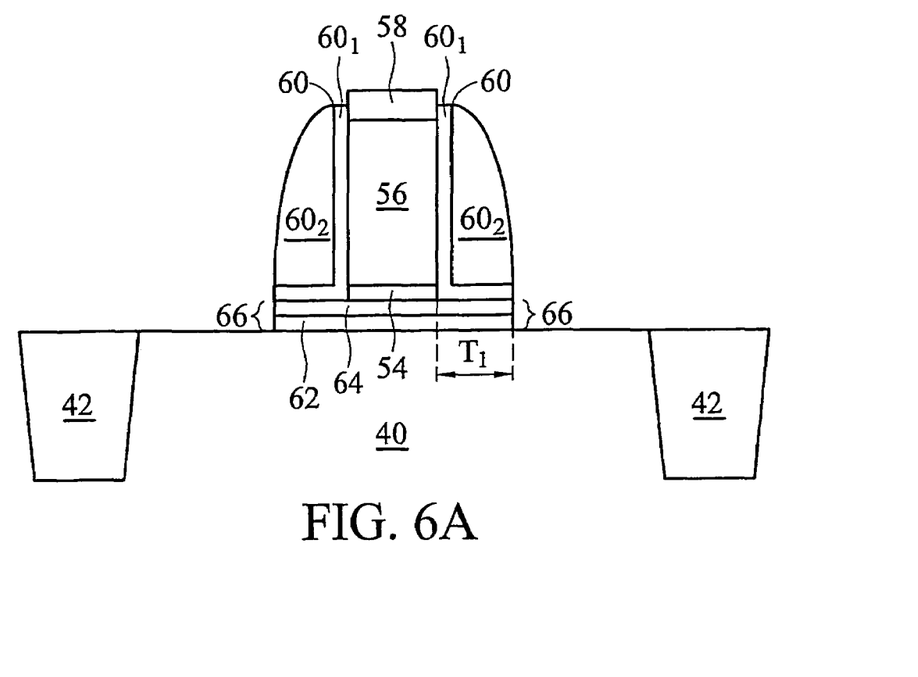

Referring to FIG. 6A, the first disposable spacers 60 are used as masks to remove exposed portions of silicon layer 46 and SiGe layer 44, preferably by using dry etch. As a result, a SiGe plate 62, a silicon plate 64 and free surfaces 66 on the sidewalls of the SiGe plate 62 and silicon plate 64 are formed. When a "free surface" is referenced, it should be interpreted as meaning that there is substantially no material covering it at the time of annealing, so that the material under the free surface is free to expand or contract to its greatest capacity, although in the final structure, the free surface is covered with materials such as a contact etch stop layer. An annealing can be performed to develop stress in silicon plate 64 and SiGe plate 62. The annealing can be performed at any time that free surfaces 66 are not covered. Since SiGe has a greater lattice constant than silicon, a tensile stress is developed in silicon plate 64 while a compressive stress is developed in SiGe plate 62. Although FIG. 6A shows that silicon plate 64 and SiGe plate 62 are co-terminus, one skilled in the art will realize that by using an additional photo mask, silicon plate 64 and SiGe plate 62 may have different sizes and/or patterns.

Figure 6B:
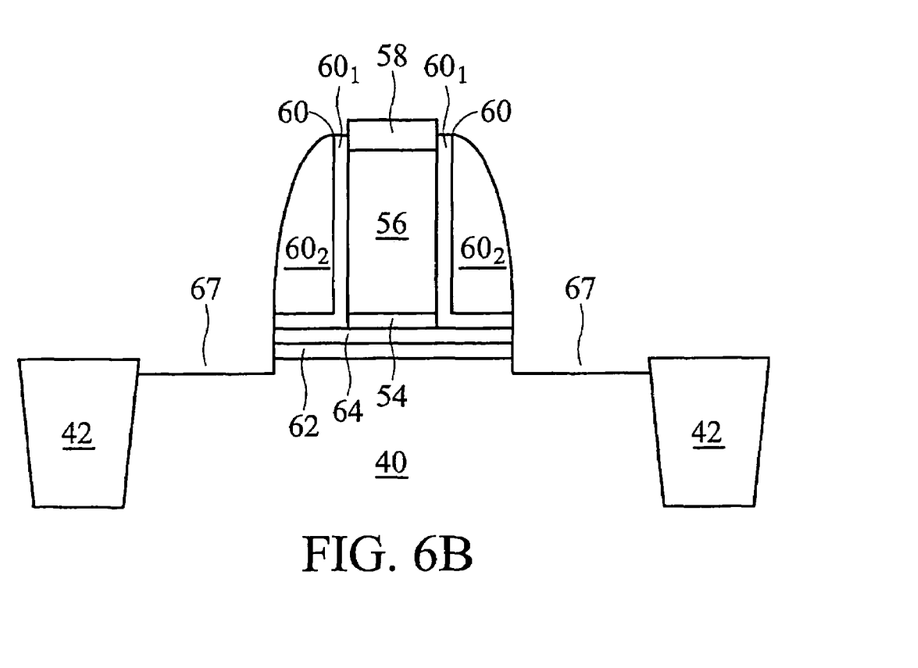

In the preferred embodiment, the removal of SiGe layer 44 stops at the surface of the substrate 40. In other embodiments, as shown in FIG. 6B, a portion of the substrate 40 may be removed, forming recesses 67.

Figure 7:
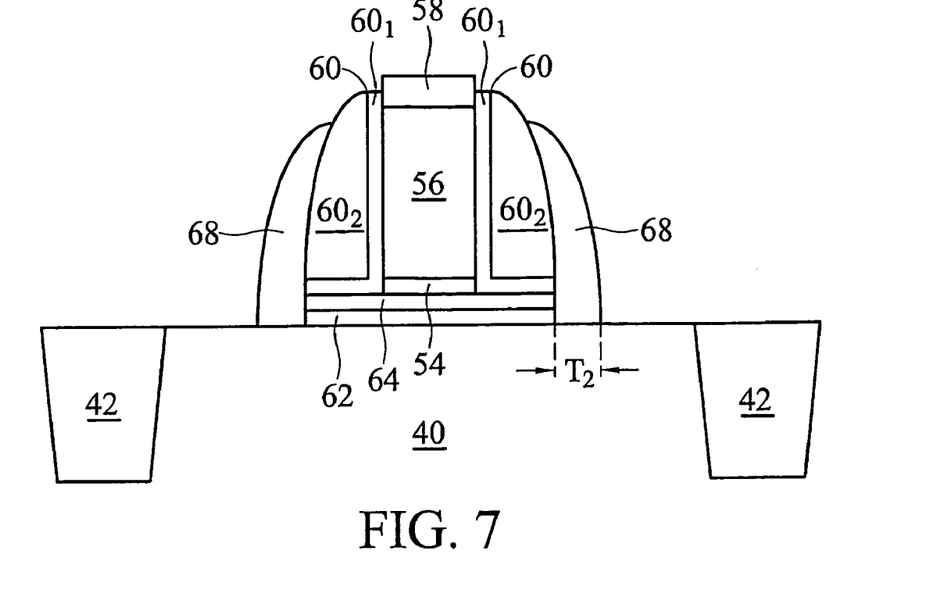

FIG. 7 illustrates the formation of second disposable spacers 68. The second disposable spacers 68 may be formed of similar or different materials from the first disposable spacers 60. The thickness $T_2$ of the second disposable spacers 68 is preferably between about 20 Å and about 300 Å.

Figure 8:
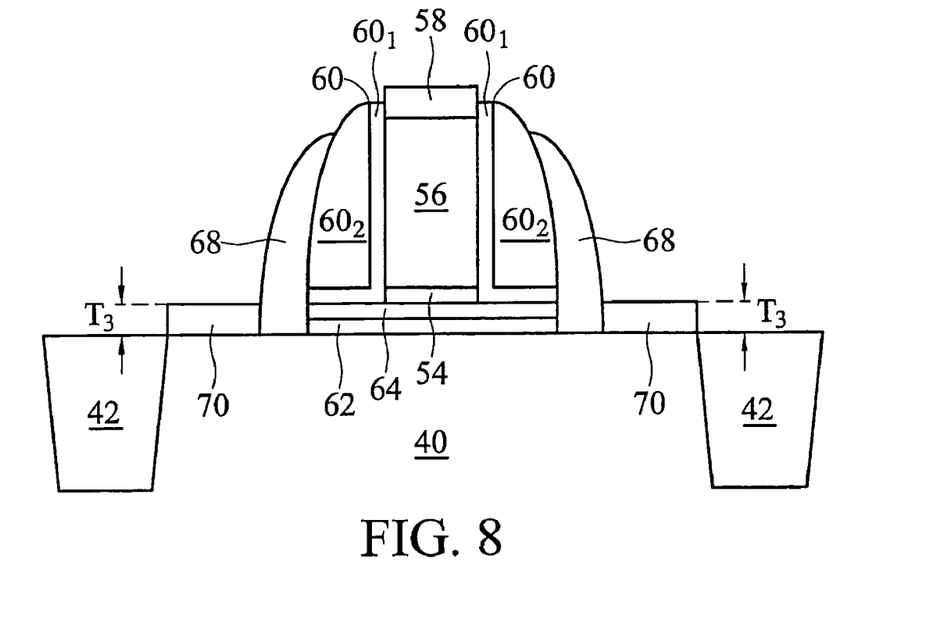

FIG. 8 illustrates the formation of an additional (silicon-containing) layer 70 on the exposed substrate 40. In the preferred embodiment, additional layer 70 is an epitaxially grown silicon layer. Alternatively, additional layer 70 comprises polysilicon or even amorphous silicon. The thickness $T_3$ of additional layer 70 is preferably greater than about 50 Å, and more preferably between about 50 Å and about 300 Å.

Figure 9:
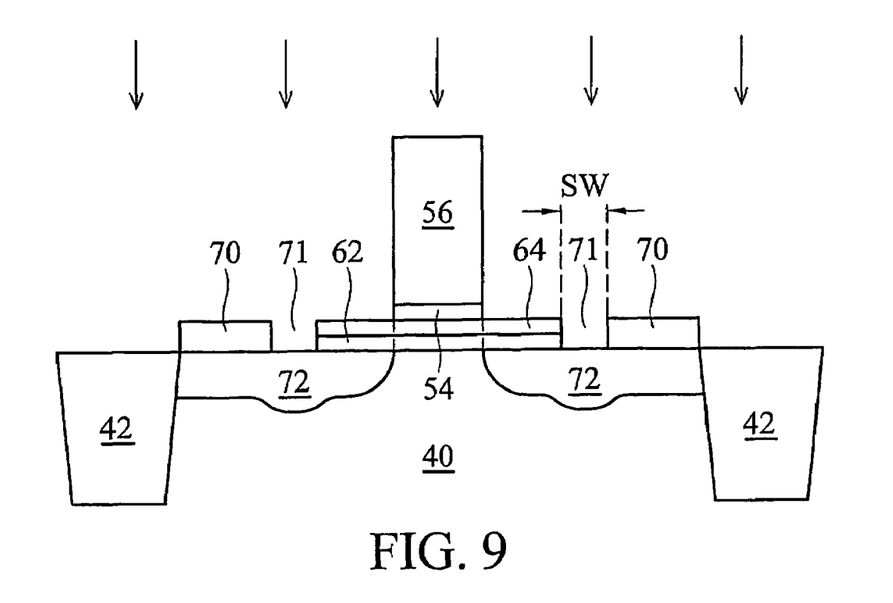

The first disposable spacers 60 and second disposable spacers 68 are then removed, leaving a structure as shown in FIG. 9. Hard mask 58 is also removed. Spaces 71 are left between additional layer 70 and SiGe plate 62 and silicon plate 64. Spaces 71 preferably have a width SW of between about 20 Å and about 300 Å. Lightly doped drain/source (LDD) regions 72 are then formed substantially aligned with the edges of the gate electrode 56, preferably by implantation of n-type impurities.

Figure 10:
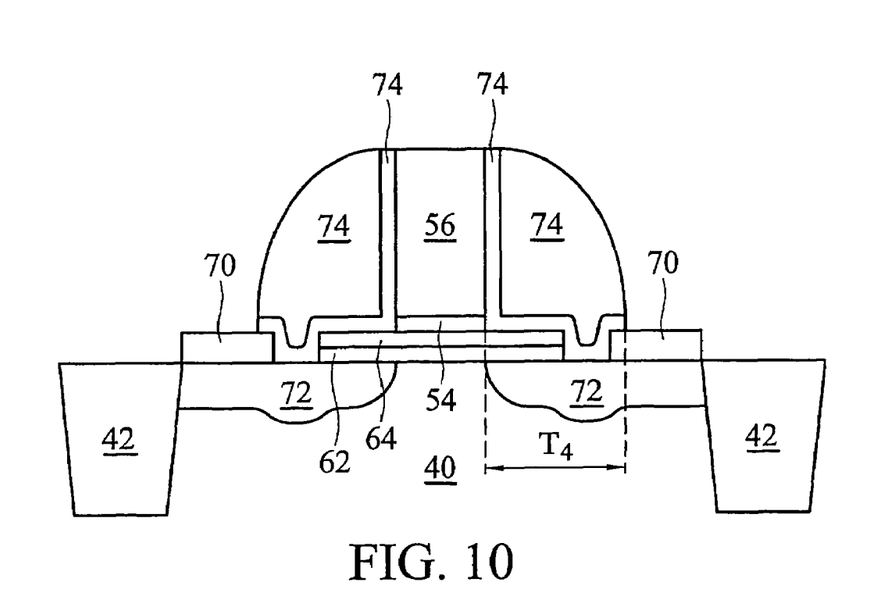

FIG. 10 illustrates the formation of spacers 74, which serve as self-aligning masks for subsequent source/drain formation steps, as will be described hereinafter. The thickness $T_4$ is preferably between about 170 Å and about 500 Å. Preferably, spacers 74 extend on the respective additional layers 70. Alternatively, the edges of spacers 74 fall on substrate 40 or on silicon plate 64. Although spacers 74 are shown to have two layers, they may also have an oxide-nitride-oxide structure or an oxide-nitride-oxide-nitride structure. One skilled in the art will realize that although dimensions are given for a better understanding of the preferred embodiment, these dimensions are only examples, and should not limit the scope of the present invention.

Figure 11:
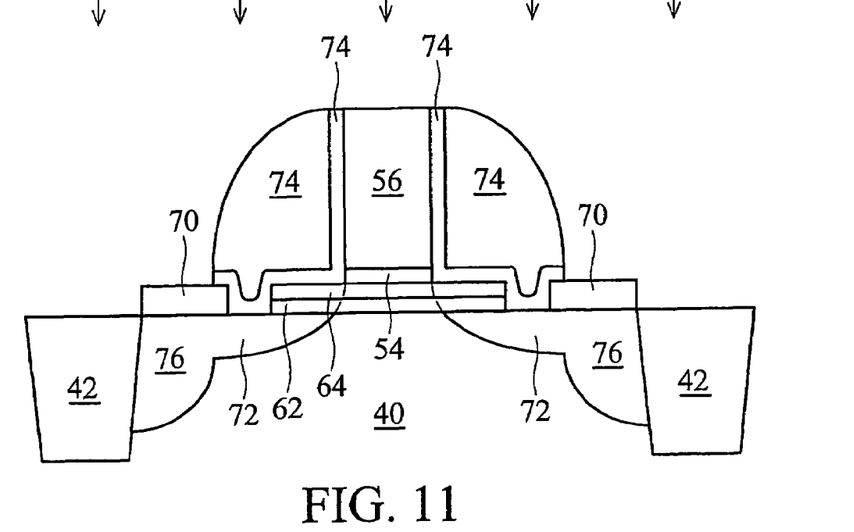

Source/drain regions 76 are then formed, as illustrated in FIG. 11. Preferably, source/drain regions 76 are formed by implanting n-type impurities using gate spacers 74 as masks.

Figure 12:
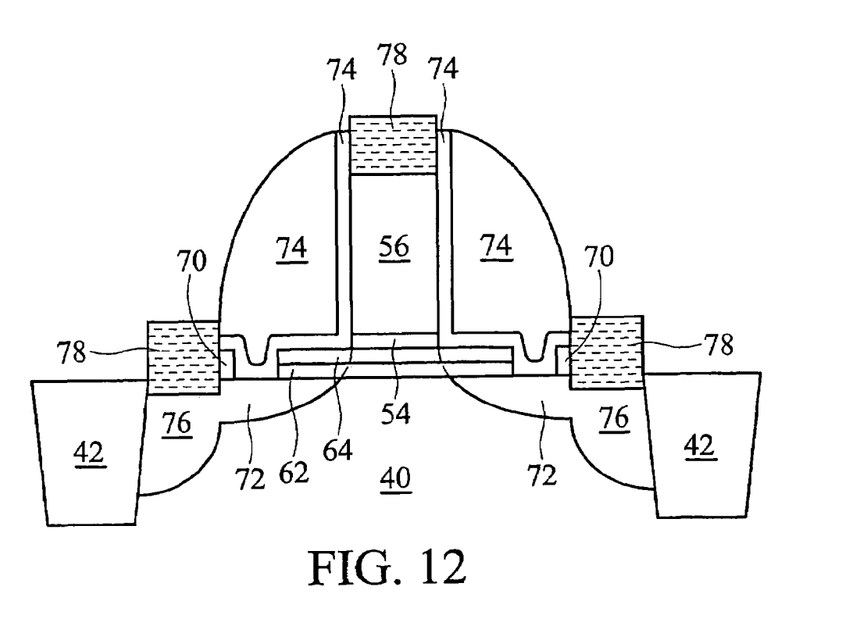

FIG. 12 illustrates the formation of silicide regions 78. A metal layer (not shown) is blanket formed on the previously formed structure. When annealed, the metal layer reacts with the underlying silicon and silicide regions 78 are formed. The un-reacted metal layer is then removed. In the preferred embodiment, the silicidation process fully consumes the exposed silicon layer 70. Silicide layer 78 is also formed on gate electrode 56. Note that there may be a portion of additional layer 70 left if the spacers 74 extend on the additional layer 70.

Figure 13:
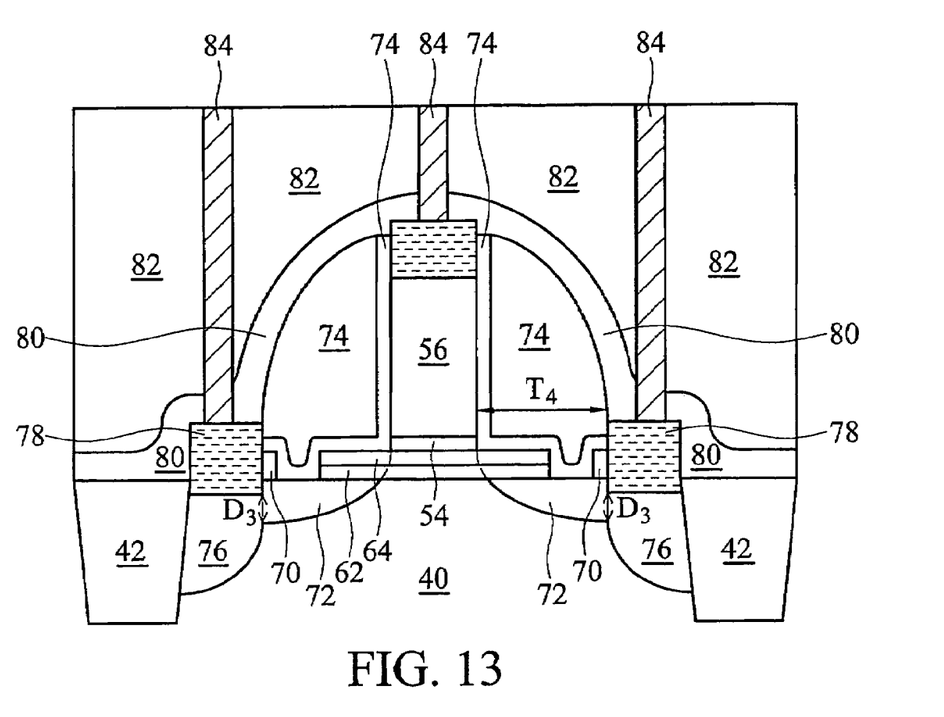

FIG. 13 illustrates the formation of a contact etch stop layer (CESL) 80, an inter-layer dielectric (ILD) 82, and contact plugs 84. CESL 80 is blanket deposited to cover the entire structure. This layer typically serves two purposes. First, it provides a stress, preferably a tensile stress for an NMOS transistor, to the device and enhances carrier mobility. Second, it acts as an etch stop layer during the formation of contact openings to protect underlying regions from being over etched. Note that the thickness $T_4$ of the spacers 74 affects how much stress can be applied by the CESL 80 to the channel region of the resulting transistor. The greater the thickness $T_4$ is, the less stress that can be applied by the CESL 80. This is why the thickness $T_4$ has to be balanced between the requirements of reducing current crowding effects and increasing stress in the channel region. Next, ILD 82 is deposited on CESL 80. Contact plugs 84 are then made through ILD 82 by forming contact openings and filling those openings with conductive materials.

By forming the additional silicon layer 70, the silicide regions 78 are raised, resulting in an increased distance $D_3$ between the silicide regions 78 and the substrate 40. As a result, the current crowding effects are reduced without the need of extending silicon plate 64 and SiGe plate 62 too far beyond edges of the gate electrode 56.

The effects of the preferred embodiments of the present invention are demonstrated by simulation results. As a comparison, embodiments having 0 Å, 100 Å and 250 Å additional silicon layers are simulated. If a transistor's leakage current in an off-state (off-current) is denoted as $I_{off}$, and the transistor's drive current is denoted as $I_{on}$, then a ratio $I_{on}/I_{off}$ indicates the transistor's ability to provide a high drive current at a low leakage current. The simulation results reveal that if there is no additional silicon layer (thickness equals 0 Å), $I_{on}/I_{off}$ is degraded by about 7 percent to about 10 percent due to current crowding effects. If the thickness of the additional silicon layer is increased to about 100 Å, $I_{on}/I_{off}$ is degraded by only about 3.4 percent. Less than about 3 percent $I_{on}/I_{off}$ degradation has been observed if the thickness of the additional silicon layer is further increased to about 250 Å. Combining the benefits of increased stress caused by free surfaces and reduced degradation caused by the additional silicon layer, the performance of the preferred embodiments of the present invention is significantly improved. The preferred embodiments of the present invention are particularly useful for future-generation MOS transistors, which have ultra-short channels and shallow junctions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
    providing a semiconductor substrate;
    forming a first semiconductor plate over the semiconductor substrate;
    forming a second semiconductor plate on the first semiconductor plate, wherein the first semiconductor plate has a substantially greater lattice constant than the second semiconductor plate;
    forming a gate stack over the first and the second semiconductor plates, wherein the first and the second semiconductor plates have extensions extending substantially beyond side edges of the gate stack, and wherein the gate stack comprises:
        a gate dielectric over the second semiconductor plate; and
        a gate electrode over the gate dielectric;
    forming an additional semiconductor layer containing silicon on the semiconductor substrate and spaced apart from the first and the second semiconductor plates;
    forming a lightly doped drain/source (LDD) region in at least the first and the second semiconductor plates and the semiconductor substrate, the LDD region being substantially aligned with an edge of the gate stack;
    forming a gate spacer along sidewalls of the gate stack and the first and the second semiconductor plates; and
    forming a source/drain region substantially aligned with an edge of the gate spacer.

2. The method of claim 1, wherein the step of forming the gate stack comprises:
    forming a gate dielectric layer;
    forming a gate electrode layer over the gate dielectric layer; and
    patterning the gate electrode layer and the gate dielectric layer to form the gate stack comprising the gate electrode and the gate dielectric, respectively.

3. The method of claim 1, wherein the steps of forming the first and the second semiconductor plates comprise:
    depositing a first semiconductor layer over the semiconductor substrate;
    depositing a second semiconductor layer on the first semiconductor layer;
    forming a first disposable spacer after the step of forming the gate stack, the first disposable spacer being along a sidewall of the gate stack and on the second semiconductor layer; and
    removing portions of the first and the second semiconductor layers uncovered by the gate stack and the first disposable spacer to form the first and the second semiconductor plates.

4. The method of claim 1, wherein the step of forming the additional semiconductor layer comprises:
    forming a second disposable spacer along the sidewalls of the first and the second semiconductor plates and on the semiconductor substrate; and
    forming the additional semiconductor layer on the semiconductor substrate.

5. The method of claim 4, wherein the method for forming the additional semiconductor layer comprises epitaxial growing the additional semiconductor layer.

6. The method of claim 1 further comprising;
    forming a silicide region on the source/drain region; and
    forming a contact etch stop layer over the gate spacer and the silicide region, the contact etch stop layer having an inherent tensile stress.

7. The method of claim 1, wherein the steps of forming the LDD region and the source/drain region comprise implanting n-type impurities.

8. The method of claim 1 further comprising an annealing step before the step of forming the gate spacer and after the steps of forming the first and the second semiconductor plates.

9. The method of claim 1, wherein the gate spacer extends onto a portion of the additional semiconductor layer.

10. The method of claim 1, wherein a space between the first and the second semiconductor plates and the additional semiconductor layer has a width of between about 20 Å and about 300 Å.

11. A method for forming an NMOS transistor, the method comprising:
    providing a semiconductor substrate comprising silicon;
    forming a SiGe layer over the semiconductor substrate;
    forming a silicon layer on the SiGe layer;
    forming a gate dielectric layer over the silicon layer;
    forming a gate electrode layer over the gate dielectric layer;
    forming a hard mask layer over the gate electrode layer;
    patterning the hard mask layer, the gate electrode layer and the gate dielectric layer to form a gate stack comprising a hard mask, a gate electrode and a gate dielectric, respectively;
    forming a first disposable spacer along a sidewall of the gate stack, the first disposable spacer being on the silicon layer;
    removing portions of the silicon layer and the SiGe layer uncovered by the gate stack and the first disposable spacer;
    forming a second disposable spacer along sidewalls of the first disposable spacer and the SiGe and the silicon layers, the second disposable spacer being on the semiconductor substrate;
    epitaxially growing an additional silicon layer on an exposed portion of the semiconductor substrate;
    removing the first and the second disposable spacers and the hard mask;
    implanting an impurity to form a lightly doped drain/source (LDD) region in the silicon layer, the SiGe layer, the additional semiconductor layer and the semiconductor substrate;
    performing an annealing;
    forming a gate spacer along sidewalls of the gate electrode, the gate dielectric, and the silicon and the SiGe layers after the annealing step; and
    implanting an n-type impurity to form a source/drain region using the gate spacer as a mask.

12. A method for forming a semiconductor structure, the method comprising:
    providing a semiconductor substrate;
    forming a structure comprising:
        a first semiconductor plate over the semiconductor substrate;
        a second semiconductor plate on the first semiconductor plate, wherein the first semiconductor plate has a substantially greater lattice constant than the second semiconductor plate;
        a gate dielectric over the second semiconductor plate; and
        a gate electrode over the gate dielectric, wherein the first and the second semiconductor plates have extensions extending substantially beyond side edges of the gate electrode;

forming an additional semiconductor layer on the semiconductor substrate, wherein the additional semiconductor layer is spaced apart from the first and the second semiconductor plates by a space; and performing an annealing before the space between the additional semiconductor layer and the first and the second semiconductor plates is filled.

13. The method of claim 12 further comprising;

forming a lightly doped drain/source (LDD) region in the first and the second semiconductor plates and the semiconductor substrate, the LDD region being substantially aligned with an edge of the gate electrode;

forming a gate spacer along sidewalls of the gate electrode, the gate dielectric, and the first and the second semiconductor plates;

forming a source/drain region substantially aligned with an edge of the gate spacer;

siliciding the source/drain region; and forming a contact etch stop layer over the gate spacer and the source/drain region.

14. The method of claim 13 wherein the steps of forming the LDD region and the source/drain region comprise implanting n-type impurities.

* * * * *